United States Patent
Sudo et al.

(10) Patent No.: US 8,189,631 B2
(45) Date of Patent: May 29, 2012

(54) EXTERNAL RESONATOR-TYPE WAVELENGTH TUNABLE LASER DEVICE

(75) Inventors: Shinya Sudo, Tokyo (JP); Kenji Sato, Tokyo (JP); Koji Kudo, Tokyo (JP); Kenji Mizutani, Tokyo (JP); Jan De Merlier, Tokyo (JP)

(73) Assignee: NEC Corporation, Tokyo (JP)

( * ) Notice: Subject to any disclaimer, the term of this patent is extended or adjusted under 35 U.S.C. 154(b) by 58 days.

(21) Appl. No.: 12/664,294

(22) PCT Filed: May 22, 2008

(86) PCT No.: PCT/JP2008/059446
§ 371 (c)(1), (2), (4) Date: May 25, 2010

(87) PCT Pub. No.: WO2008/152893
PCT Pub. Date: Dec. 18, 2008

(65) Prior Publication Data
US 2010/0246618 A1    Sep. 30, 2010

(30) Foreign Application Priority Data
Jun. 13, 2007  (JP) .................................. 2007-156214

(51) Int. Cl.
*H01S 3/13* (2006.01)
(52) U.S. Cl. ..................................... 372/29.023; 372/31
(58) Field of Classification Search ............ 372/25, 372/38.01, 38.02, 92
See application file for complete search history.

(56) References Cited

U.S. PATENT DOCUMENTS 5,987,041 A * 11/1999 Taniguchi et al. ............ 372/12
6,611,546 B1 * 8/2003 Garnache et al. ............ 372/92
7,295,582 B2 * 11/2007 McDonald et al. ........... 372/20

FOREIGN PATENT DOCUMENTS

| JP | 4-69987 A | 3/1992 |
| JP | 11-214799 A | 8/1999 |
| JP | 11-233894 A | 8/1999 |

(Continued)

OTHER PUBLICATIONS

International Search Report for PCT/JP2008/059446 mailed Jul. 8, 2008.

(Continued)

*Primary Examiner* — Jessica Stultz
*Assistant Examiner* — Tuan Nguyen

(57) ABSTRACT

The present invention provides an external resonator-type wavelength tunable laser device that can properly fulfill a wavelength tuning function even with the use of a planar wavelength tunable reflector involving a considerable level of residual reflection. The external resonator-type wavelength tunable laser device includes a planar reflection structure enabling a reflection spectral peak wavelength to be varied and a semiconductor element as a semiconductor gain medium. The semiconductor gain medium is composed of a multiple quantum well in which product $\Gamma \cdot L$ of optical confinement constant $\Gamma$ and semiconductor gain medium length $L$ (μm) of a gain layer is at least 25 μm and at most 40 μm and in which gain peak wavelength $\lambda 0$ (nm) observed during carrier injected with a maximum modal gain equal to an internal loss of the semiconductor gain medium is larger than $-3 \cdot \Delta R/2 + (\lambda c + 35)$ and smaller than $(-(\Gamma \cdot L)/7 + 8) \cdot \Delta R + (-(\Gamma \cdot L) + \lambda c + 45)$. Here, $\Delta R$ (dB) denotes a reflectance difference, and $\lambda c$ (nm) denotes a wavelength at a center of an operating wavelength range of the wavelength tunable laser device.

5 Claims, 7 Drawing Sheets

FOREIGN PATENT DOCUMENTS

| | | |
|---|---|---|
| JP | 2000261086 A | 9/2000 |
| JP | 2002374037 A | 12/2002 |
| JP | 2003023208 A | 1/2003 |
| JP | 2003264335 A | 9/2003 |
| JP | 2004165592 A | 6/2004 |
| JP | 2005123345 A | 5/2005 |
| JP | 2006186250 A | 7/2006 |
| WO | 2007069734 A | 6/2007 |

OTHER PUBLICATIONS

J. A Merlier et al., "Full C-Band External Cavity Wavelength Tunable Laser Using a Liquid-Crystal-Based Tunable Mirror", IEEE Photonics Technology Letters, Mar. 2005, vol. 17, No. 3, pp. 681-683.

* cited by examiner

EXTERNAL RESONATOR-TYPE WAVELENGTH TUNABLE LASER DEVICE

The present application is the National Phase of PCT/JP2008/059446, filed May 22, 2008, which claims a priority based on Japanese Patent Laid-Open No. 2007-156214 filed on Jun. 13, 2007, and incorporates the entire disclosure thereof.

TECHNICAL FIELD

The present invention relates to an external resonator-type wavelength tunable laser device including a planar reflection structure enabling a reflection spectral peak wavelength to be varied, and a semiconductor optical amplifier contained in the wavelength tunable laser device to use as a semiconductor gain medium.

BACKGROUND ART

With the recent rapid prevalence of the Internet, there has been a demand for a further increase in the capacity of communication traffic. To deal with this, efforts have been made, in the field of optical communication systems, to increase the number of available channels by improving the transmission rate per channel and by utilizing a wavelength division multiplexing (WDM) scheme.

The WDM is a scheme to simultaneously transmit a large number of optical signals with different carrier wavelengths (channels). The WDM allows transmissions via a single optical fiber, thus enabling communication capacity to be increased consistently with the number of channels.

For example, when 100 channels are transmitted via one common optical fiber based on modulation at 10 Gigabits/sec per channel, the communication capacity can be increased to 1 terabits/sec.

The recent medium- and long-distance optical communication commonly uses a C band (1,530 to 1,570 nanometers) that can be amplified by an optical fiber amplifier (EDFA, Erbium Doped Fiber Amplifier). Furthermore, to allow a further increase in communication capacity, an L band (1570 to 1610 nanometers) may be used.

In general, the WDM system requires different laser devices for respective wavelengths. Thus, the manufacturer and user of the WDM system need to prepare laser devices corresponding to the wavelengths of standard channels. For example, 100 channels require the respective, 100 types of laser devices, resulting in an increase in the need for inventory control and an increase in inventory costs.

Thus, in WDM systems, particularly medium- and long-distance communication systems, there has been a demand for practical application of a wavelength tunable laser device allowing all the wavelengths of the C band (or L band) to be covered by the single laser device. When the entire C band (or L band) can be covered by the single laser device, the manufacturer and user have only to prepare the single laser device. Thus, the need for inventory control and inventory costs can be sharply reduced.

In order to construct a high-capacity, high-performance, and reliable optical communication network, it is essential to provide a technique for allowing a light emitting device to freely change and to control the wavelength. A wavelength tunable laser device built into the communication system is a very important key device for controlling of the wavelength.

Many methods for implementing a wavelength tunable laser device that meets these demands have been proposed.

In this connection, Japanese Patent Laid-Open No. 2003-023208 (hereinafter referred to as Patent Document 1) describes a structure in which a large number of distribution feed-back semiconductor laser (DFB laser) elements with different laser oscillation wavelengths are arranged in parallel. In the structure, the semiconductor laser elements are switched for rough adjustment and a variation in refractive index caused by temperature is utilized for fine adjustment.

However, the structure requires an optical coupler to collectively couple output ports of the large number of laser elements to an optical fiber. Thus, an increase in the number of laser elements arranged in parallel correspondingly increases the loss of the coupler. Consequently, the variable range of the wavelength and an optical output are in a trade-off relationship.

On the other hand, much effort has been made to research and develop external resonator-type wavelength tunable laser devices expected to avoid the above-described trade-off relationship to meet the demand for wavelength control.

The external resonator-type wavelength tunable laser device uses a semiconductor optical amplifier (SOA) corresponding to a semiconductor gain region and an external reflection mirror to form a resonator. A reflection structure enabling the wavelength to be varied (wavelength tunable reflector) is inserted into the resonator to allow the wavelength to be selected. The external resonator-type wavelength tunable laser device relatively easily provides a wavelength tunable range that covers the entire C band.

Most of the basic characteristics of wavelength tunable laser devices of this type are determined by the wavelength tunable reflector. Thus, various wavelength tunable structures with excellent characteristics have been developed. For example, Japanese Patent Laid-Open No. 04-69987 (hereinafter referred to as Patent Document 2) and Japanese Patent Laid-Open No. 2000-261086 (hereinafter referred to as Patent Document 3) disclose reflection structures using an acoustic engineering filter, a dielectric filter, an etalon, or the like.

A variety of external resonator-type wavelength tunable laser devices use such a wavelength tunable structure. In particular, a configuration that has, in addition to a gain medium, a periodic channel selection filter, a wavelength tunable filter, and a reflection mirror as disclosed in Patent Document 3 is effective for providing a high-performance light source.

For example, an etalon, which offers periodic frequency characteristics, is used as a periodic channel selection filter. Furthermore, an acoustic engineering filter is used as a wavelength tunable filter. An electrically controlled wavelength tunable reflector is used as a wavelength tunable reflector.

An electrically drivable, planar wavelength tunable reflector is effective for providing a small, inexpensive, and reliable external resonator-type wavelength tunable laser device. Such a structure is disclosed in, for example, Non-Patent Document 1 described below.

[Non-Patent Document 1] J. De. Merlier et. al., "FullC-Band External Cavity Wavelength Tunable Laser Using a Liquid-Crystal-Based Tunable Mirror", IEEE PHOTONICS TECHNOLOGY LETTERS, March, 2005, Volume 17, No. 3, pp. 681-683 (FIG. 1(a)).

On the other hand, a fiber Bragg grating laser is known as an external resonator-type laser device including a combination of a semiconductor optical amplifier and a wavelength-fixed reflection mirror. The principle of the fiber Bragg grating laser is described in, for example, Japanese Patent Laid-Open No. 11-214799 (hereinafter referred to as Patent Document 4) in detail.

Even if the reflection peak wavelength of the fiber Bragg grating is different from the gain peak wavelength of the semiconductor optical amplifier, provided that the two peak wavelengths are close to each other, the laser device can be oscillated at the reflection peak wavelength of the fiber Bragg grating. On the other hand, when the two peak wavelengths are significantly different, the laser device oscillates at the gain peak wavelength of the semiconductor optical amplifier.

The range of the difference between the reflection peak wavelength of the fiber Bragg grating and the gain peak wavelength of the semiconductor optical amplifier needs to be properly set in order to allow the laser device to oscillate at the reflection peak wavelength. The range to be achieved is called an available wavelength range.

However, it has been found that when a planar wavelength tunable reflector is used to construct an external resonator-type wavelength tunable laser device in an attempt to obtain wavelength tunable characteristics, the laser device may disadvantageously oscillate at a wavelength that is different from the reflection spectral peak of the wavelength tunable reflector used.

The cause of this phenomenon has been examined and found to be that the planar wavelength tunable reflector involves a considerable level of reflection (hereinafter referred to as residual reflection) at wavelengths that are different from the reflection spectral peak.

The reflection spectral peak wavelength of the wavelength tunable reflector is defined as The reflectance of the wavelength tunable reflector obtained at wavelength $\lambda 1$ is defined as $R1(\%)$. The reflectance of the wavelength tunable reflector obtained at wavelength $\lambda 2$ that is different from the wavelength $\lambda 1$ is defined as $R2(\%)$. Reflectance difference $\Delta R$ (dB) is defined by $\Delta R=10 \cdot \log(R1/R2)$. Then, some devices only have reflectance difference $\Delta R$ of about 6 dB to 8 dB.

Conventionally, a semiconductor optical amplifier corresponding to a semiconductor gain region combined with an external resonator-type laser (for example, a fiber Bragg grating laser) normally involves a relatively large number of, about 6 to 10 layers of quantum wells and a large element length of at least 1,000 μm because the external resonator generally suffers a great loss.

For example, if a fiber Bragg grating laser is constructed by combining a semiconductor optical amplifier including a multiple quantum well (MQW) with eight active layers and having an element length of 1,000 μm and a planar reflection structure with a reflectance difference of 6 dB to 8 dB, the wavelength range will be between about 30 nm and 35 nm.

The wavelength range of a wavelength laser such as a fiber Bragg grating laser is within the available wavelength range. The wavelength range of such a single-wavelength laser thus corresponds to the working range of gain peak wavelength $\lambda p$ of the semiconductor optical amplifier within which the laser device can be oscillated at intended wavelength $\lambda B$ specified for the fiber Bragg grating. That is, the laser device may be produced such that gain peak wavelength $\lambda p$ is within the available wavelength range which is predetermined. The range of 30 nm to 35 nm is a sufficiently large tolerance and can be easily achieved.

However, this is disadvantageous to the wavelength tunable laser device. The disadvantage will be described below with reference to FIGS. 1 to 3.

FIG. 1 is a graph illustrating an available wavelength range in a simplified manner. As shown in FIG. 1, regardless of gain peak wavelength $\lambda p$ of the semiconductor optical amplifier, which is shown on the axis of abscissa, the laser device oscillates, within a certain range of gain peak wavelength $\lambda p$ (available wavelength range), at optical wavelength $\lambda B$ selected by a wavelength selecting reflection structure (fiber Bragg grating).

This is shown in FIG. 2 in a more simplified manner so as to be easily understood in the following description.

FIG. 2 indicates that if the gain peak wavelength of the semiconductor optical amplifier is within the range shown by an arrow as an available wavelength range, the laser device can oscillate at optical wavelength $\lambda B$ shown by an arrow.

FIG. 3 illustrates the possible range of the gain peak wavelength of the semiconductor optical amplifier contained in the wavelength tunable laser device; the range is based on FIG. 2.

The wavelength tunable laser device has an intended wavelength tunable range such that the device needs to be able to oscillate at all selected wavelengths within the range. That is, as shown in FIG. 3, available wavelength ranges shown in FIG. 3 are set based on minimum wavelength $\lambda 5$ and maximum wavelength $\lambda 6$ of the desired wavelength tunable range. The overlapping part between the available wavelength ranges each including minimum wavelength $\lambda 5$ or maximum wavelength $\lambda 6$ is set to be the range of gain peak wavelength $\lambda p$. Then; the wavelength tunable laser device can be operated by a single semiconductor optical amplifier.

As is apparent from FIG. 3, a narrower available wavelength range and a wider wavelength tunable range (a larger difference between wavelength $\lambda 5$ and wavelength $\lambda 6$) contribute to reducing the possible range of gain peak wavelength $\lambda p$, which is difficult to achieve.

The wavelength tunable laser device taken above as an example and configured as follows offers only an available wavelength range of 30 nm to 35 nm, as described above: the laser device includes a built-in semiconductor optical amplifier comprising eight layers of MQWs and having an element length of 1,000 μm and a built-in planar wavelength tunable reflector with a reflectance difference $\Delta R$ of 6 dB to 8 dB.

Thus, the wavelength tunable laser device with a wavelength tunable range of 30 nm to 35 nm or more fails to offer the possible range of gain peak wavelength $\lambda p$ of the semiconductor optical amplifier. That is, the desired wavelength tunable range of the wavelength tunable laser device cannot be achieved.

The above-described condition is a new limit on the wavelength tunable laser device. It is thus very difficult to provide a wavelength tunable laser device with the desired wavelength tunable range based on the control only of gain peak wavelength $\lambda p$ of the semiconductor optical amplifier.

This problem is particularly significant when the wavelength tunable range of the wavelength tunable laser device is set to be equal to or wider than the range of about 30 nm to 35 nm, generally corresponding to a full band operation in one communication wavelength band.

As described above, an external resonator-type wavelength tunable laser device using a wavelength tunable reflector involving residual reflection disadvantageously oscillates at a wavelength that is not similar to the one selected by the wavelength tunable reflector.

To solve this problem, the residual reflection in the wavelength tunable reflector may be reduced. However, in the planar reflection structure, setting $\Delta R$ to at least 20 dB is very difficult. With possible mirror production process techniques, $\Delta R$ is often set to less than 16 dB.

DISCLOSURE OF THE INVENTION

An object of the present invention is to provide an external resonator-type wavelength tunable laser device that can solve at least one of the above-described problems. An example of a specific object is to provide an external resonator-type wavelength tunable laser device that can properly fulfill a wavelength tuning function even with the use of a planar wavelength tunable reflector involving a considerable level of residual reflection. Another specific object is to provide a semiconductor optical amplifier serving as a component of the wavelength tunable laser device and corresponding to a semiconductor gain medium, in order to provide the wavelength tunable laser device.

An aspect of the present invention provides an external resonator-type wavelength tunable laser device including at least a planar reflection structure enabling a reflection spectral peak wavelength to be varied and a semiconductor gain medium.

The semiconductor gain medium contained in the external resonator-type wavelength tunable laser device comprises a multiple quantum well in which product $\Gamma \cdot L$ of optical confinement constant $\Gamma$ and semiconductor gain medium length $L$ ($\mu$m) of a gain layer in the semiconductor gain medium is at least 25 $\mu$m and at most 40 $\mu$m and in which gain peak wavelength $\lambda 0$ (nm) observed during carrier injected with a maximum modal gain equal to an internal loss of the semiconductor gain medium is larger than $-3 \cdot \Delta R/2 + (\lambda c + 35)$ and smaller than $(-(\Gamma \cdot L)/7 + 8) \cdot \Delta R + (-(\Gamma \cdot L) + \lambda c + 45)$.

In the above-described expressions, reflectance difference $\Delta R$ (dB) of the planar reflection structure is defined by $\Delta R = 10 \cdot \log(R1/R2)$, in which R1 denotes reflectance R1(%) of the planar reflection structure at the reflection spectral peak wavelength thereof and R2 denotes reflectance R2(%) of the reflection structure at a wavelength at which the gain of the semiconductor gain medium is maximized during laser oscillation. A wavelength at a center of an operating wavelength range of the wavelength tunable laser device is defined as $\lambda c$ (nm).

DESCRIPTION OF SYMBOLS

Figure 1:
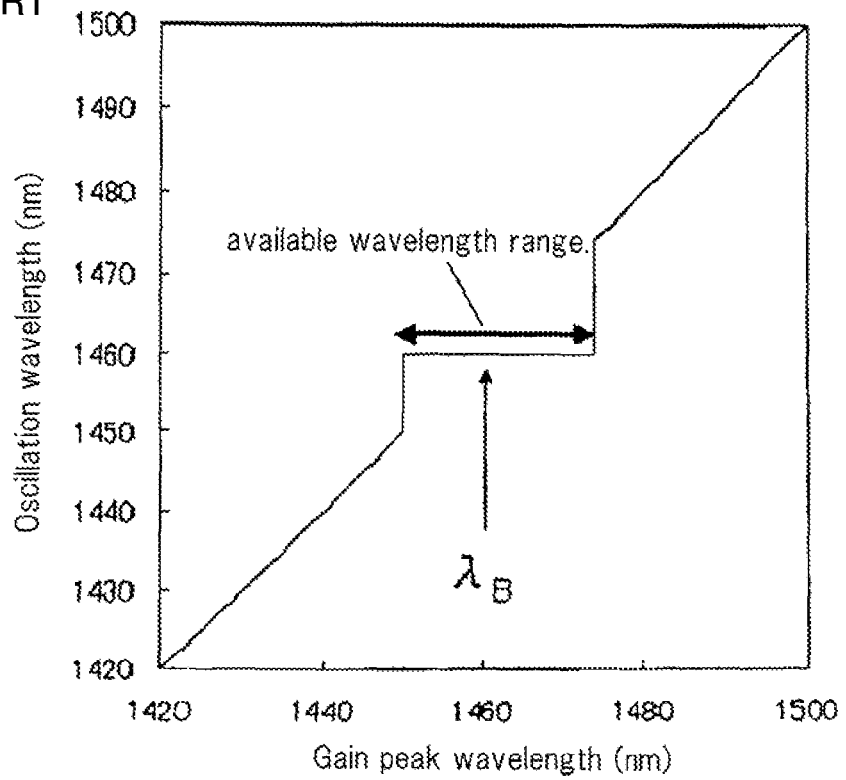
FIG. 1 is a diagram showing the available wavelength range of a fiber Bragg grating laser.
Figure 2:
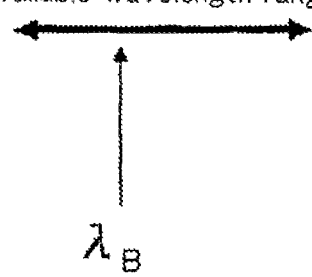
FIG. 2 is a diagram illustrating the available wavelength range in a simplified manner.

1 Semiconductor element
2 Wavelength tunable reflector
3 Semiconductor optical amplifier
4 Phase adjustment region
5 Low-reflection coating film
6 Anti-reflection coating film
7 collimating lens
8 Wavelength tunable filter
9 Sub-carrier
10 Wavelength tunable filter
11 Total reflection mirror
12 Wavelength tunable reflection mirror

BEST MODE FOR CARRYING OUT THE INVENTION

An external resonator-type wavelength tunable laser device according to the present invention will be described below in detail.

The external resonator-type wavelength tunable laser device disclosed in the present invention includes a semiconductor gain medium and a planar reflection structure enabling the reflection spectral peak wavelength to be varied.

As described above, the planar reflection structure generally involves residual reflection. Setting reflectance difference $\Delta R$ of the wavelength tunable reflector to at least 16 dB is very difficult. Thus, the present invention is very effective at about 16 dB or lower.

A semiconductor optical amplifier contained in a conventional external resonator-type laser device as a semiconductor gain region commonly causes the external resonator to suffer a great loss. Thus, to allow a reduction in threshold current, optical confinement coefficient $\Gamma$ and element length $L$ are often increased. The desired wavelength tunable range cannot be achieved by applying such a semiconductor optical amplifier to an external resonator-type wavelength tunable laser device intended to offer a wavelength tunable range of 30 nm to 35 nm. Thus, the present invention is effective on such a semiconductor optical amplifier.

Now, the principle of the present invention will be described in detail.

When the loss of an external resonator and the gain of the semiconductor gain medium are equal, the external resonator-type laser device oscillates at the corresponding wavelength.

If a wavelength tunable reflector is used for an external reflection mirror, the loss of the external resonator varies depending on wavelength and is smallest at the wavelength selected by the reflection structure. This is because the reflectance is highest at a wavelength selected by the reflection structure, thus increasing the quantity of light fed back to the resonator.

The magnitude relationship between the absolute difference in loss ΔLoss and gain difference Δg is important for an external resonator-type wavelength tunable laser device using the above-described wavelength tunable reflector; absolute difference ΔLoss is the difference between the loss at wavelength λ1 selected by the wavelength tunable reflector and the loss at gain peak wavelength λ2 of the semiconductor optical amplifier, and gain difference Δg is the difference between the gain of the semiconductor gain medium at wavelength λ1 and the gain of the semiconductor gain medium at wavelength λ2.

In this case, allowing Δg during oscillation to be set to be smaller than ΔLoss prevents the laser device from oscillating at wavelength λ2, while enabling the laser device to stably oscillate at desired wavelength λ1.

Figure 3:
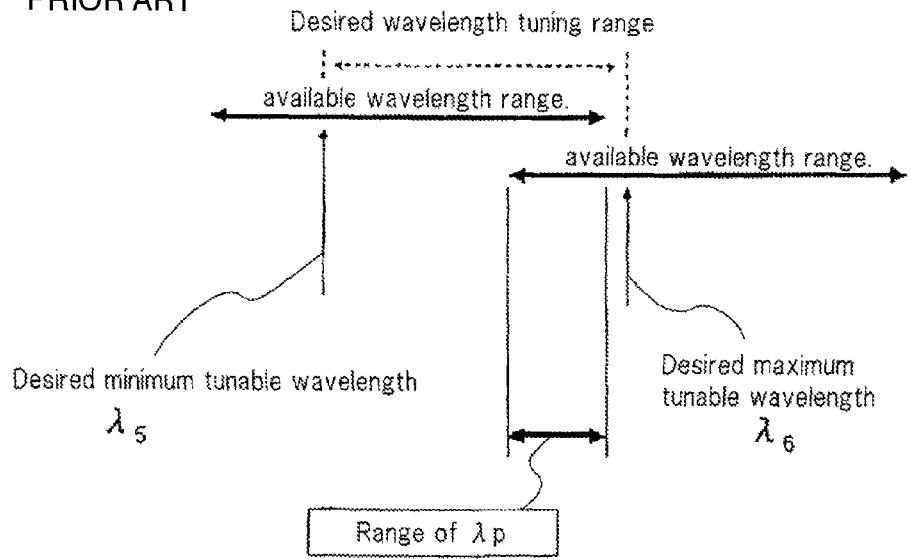
FIG. 3 is a diagram showing the possible range of gain peak of a semiconductor optical amplifier contained in a wavelength tunable laser device.
Figure 4:
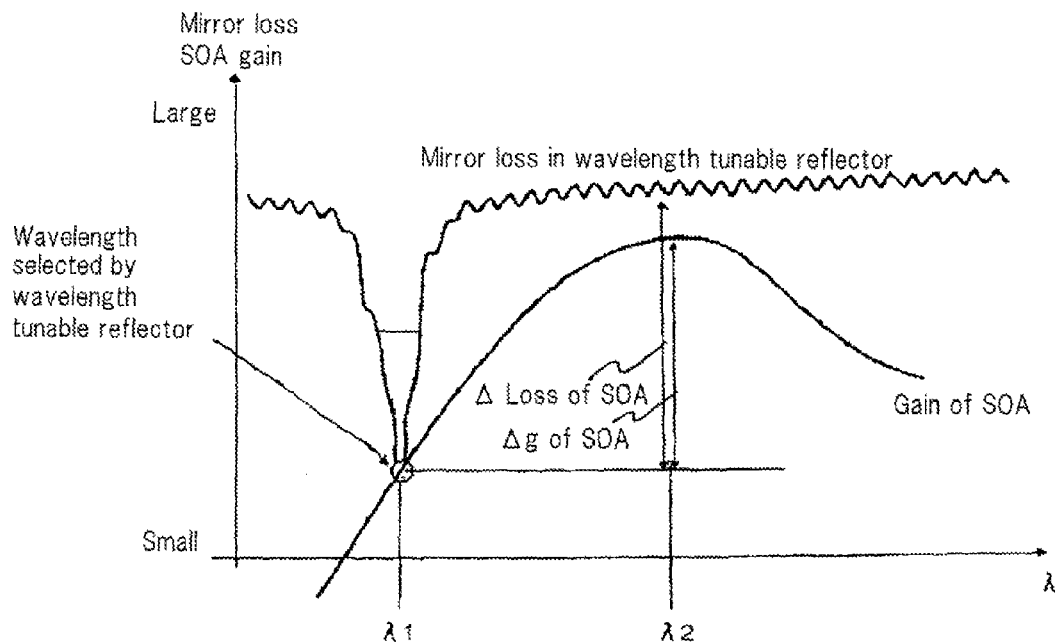
FIG. 4 is a diagram showing the relationship, in a wavelength tunable laser device containing a semiconductor optical amplifier according to the present invention, between the loss of a wavelength tunable reflector and the gain of the semiconductor optical amplifier.
Figure 5:
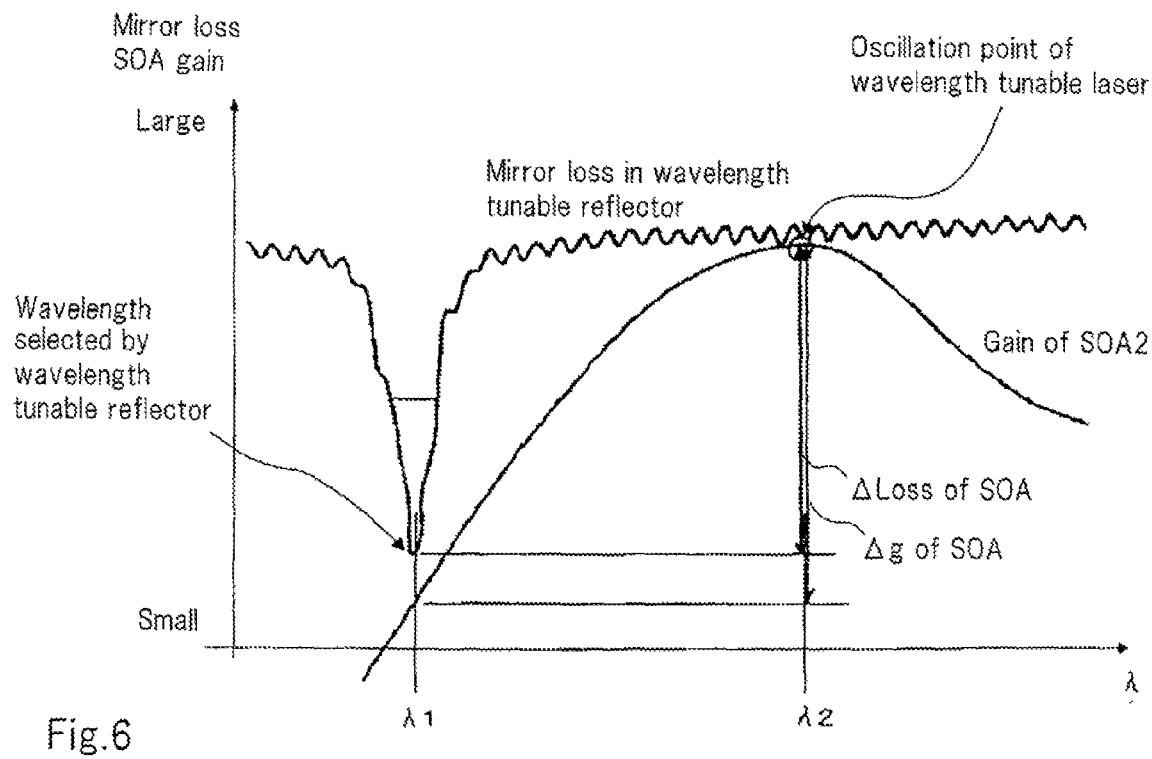
FIG. 5 is a diagram showing the relationship between the loss of the wavelength tunable reflector and the gain of the semiconductor optical amplifier observed when residual reflection, if any, prevents the laser device from oscillating at a desired wavelength.

This relationship is shown in FIG. 4. When described using the concept of the available wavelength range shown in FIG. 3, the condition shown in FIG. 4 is equivalent to an increase in available wavelength range at each wavelength. The reversed magnitude relationship between ΔLoss and Δg is shown in FIG. 5. In this case, the laser device cannot oscillate at selected wavelength λ1.

As described above, setting Δg during oscillation to be smaller than ΔLoss is important for allowing the laser device to oscillate at desired wavelength λ1.

In connection with the magnitude relationship between Δg and ΔLoss, finding an index for a semiconductor gain region which indicates the relationship is important.

In general, in the semiconductor gain region, because of the nature of a semiconductor, injection of a current causes the dependence of modal gain of the amplifier on the wavelength to vary depending on a carrier density of a well. Thus, an index relating to carrier density at the threshold current is important. Thus, the present inventors have found that a gain curve can be smoothed by using, as an index, Γ·L that is the product of optical confinement coefficient Γ relating to the thickness of a gain layer (active layer) in the semiconductor gain region and element length L relating to the length of the active layer; the values correspond to the standardized volume of the gain layer.

The inventors have also found that an external resonator-type wavelength tunable laser device operating within the desired absolute wavelength range can be implemented by setting both Γ·L and the gain peak wavelength λ0 of a light emission layer to be within appropriate ranges; the gain peak wavelength λ0 is observed when the maximum modal gain is equal to the internal loss of the semiconductor optical amplifier.

The width of the active layer is unsuitable as a parameter because the width has almost no degree of freedom in terms of realization of a single traverse mode, element resistance, and the like.

Furthermore, the present inventors have concluded that Γ·L may be effective as an index indicating whether or not the wavelength tunable laser device is operable, based on the following idea.

A condition for establishing the situation shown in FIG. 4 is derived from an expression for laser oscillation conditions. The condition for establishing the situation at wavelength λ1 is:

$$\Gamma \cdot gm(\lambda 1) - \alpha i = (1/L) \cdot \text{Ln}(1/(R1 \cdot Rf))$$

In this condition expression, αi denotes the internal loss, and Rf denotes the reflectance of a facet located opposite the reflection structure. R1 denotes the reflectance of the reflection structure at wavelength λ1, and gm(λ1) denotes the material gain of the active layer at wavelength λ1.

Similarly, a condition to be established at wavelength λ2 is derived as follows using the material gain gm(λ2) of the active layer at λ2.

$$\Gamma \cdot gm(\lambda 2) - \alpha i < (1/L) \cdot \text{Ln}(1/(R2 \cdot Rf))$$

This allows the laser device to oscillate at wavelength λ1 without oscillating at wavelength λ2. The left terms of the above-described two expressions are subtracted from each other, and the right terms of the above-described two expressions are subtracted from each other.

Then, the following expression is given.

$$(gm(\lambda 2) - gm(\lambda 1)) < (1/L) \cdot \text{Ln}(R1/R2)$$

Moreover, given that gm(λ2)−gm(λ1)=Δgm, ΔR can be used to obtain the following expression.

$$\Gamma \cdot L < \Delta R / \Delta gm \cdot 1/(10 \cdot \log(e))$$

Thus, the present inventors have expected that Γ·L can be used as a universal index allowing the situation shown in FIG. 5 to be established according to reflectance difference ΔR, determined by the wavelength tunable reflector, and material gain difference Δgm, determined by the component of the active layer in the semiconductor gain medium.

Then, the present inventors experimentally checked whether or not the above Γ·L can be actually utilized as an index indicating whether or not the wavelength tunable laser device is operable.

The present inventors examined a semiconductor optical amplifier serving as a semiconductor gain medium and required that the wavelength tunable range be set equal to a C band, that is, the range of 1,530 nm to 1,570 nm, used for optical communication if ΔR be 10 dB, and the optical loss during one cycle of the external resonator-type wavelength tunable laser device be between 20 dB and 25 dB.

The present inventors first experimentally determined the dependence of material gain spectrum gm(λ,J) of the active layer of interest on current density J. The present inventors have thus obtained an appropriate expression.

This gain curve enables target λ0 to be achieved with the shape of the gain curve almost unchanged. To accomplish this, only the wavelength needs to be changed with the strain of the active layer remaining unchanged. For example, for InGaAsP, an InGa ratio and an AsP ratio may be changed.

Then, the inventors estimated internal loss αi of the resonator based on the external resonator and active layer structure both included in the laser device. Then, based on the characteristics of the planar wavelength tunable reflector in which ΔR=10 dB, the dependence of mirror loss αm on the wavelength was calculated using element length L of the semiconductor optical amplifier.

These numerical values are substituted into $\Gamma \cdot gm(\lambda, J) = \alpha i\, Em(\lambda)$, which is indicative of the principle of laser oscillation, to determine the range within which the laser device can oscillate at selected wavelength $\lambda s$, that is, the available wavelength range, at minimum wavelength $\lambda 5$ and at maximum wavelength $\lambda 6$. Then, the region in which the resulting available wavelength ranges overlap is determined.

The region indicates the range of the gain peak wavelength $\lambda p$ (FIG. 3). However, to be made more universal, the range of $\lambda p$ has been replaced with the gain peak wavelength $\lambda 0$ observed during carrier injected with the maximum modal gain equal to the internal loss of the semiconductor gain medium. The resulting range is shown in FIG. 6.

Figure 6:
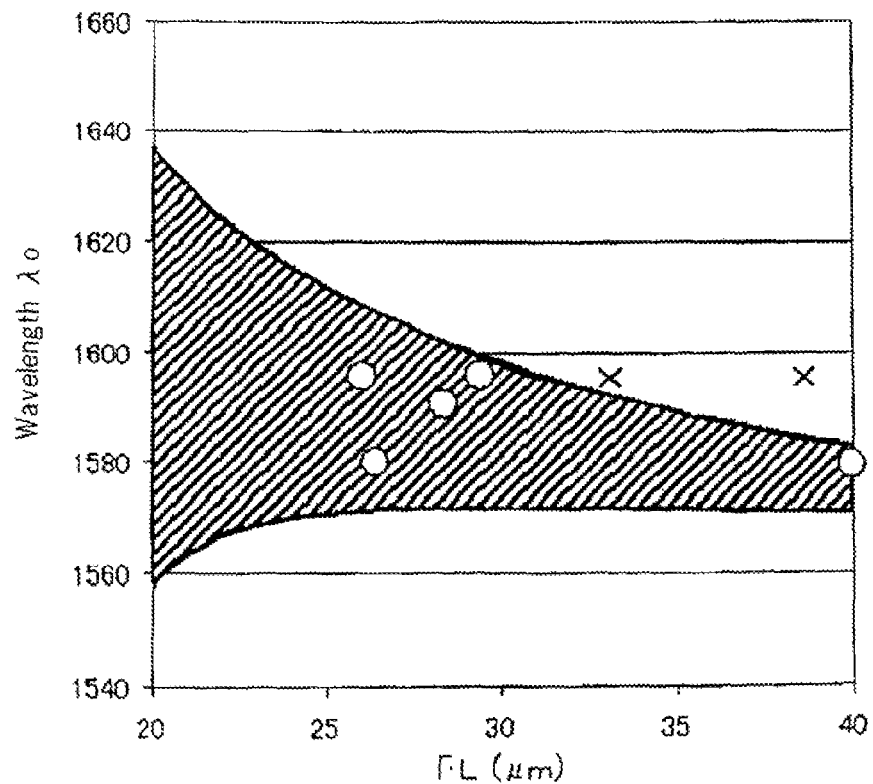
FIG. 6 is a diagram showing the range of a laser oscillation condition that the semiconductor optical amplifier must meet in order to obtain a wavelength tunable range of 1,530 nm to 1,570 nm if $\Delta R=10$ dB and an optical loss during one cycle of the external resonator-type wavelength tunable laser device is 20 dB to 25 dB.

As shown in FIG. 6, $\Gamma \cdot L$ and $\lambda 0$ that are required to obtain the wavelength tunable range of 1,530 nm to 1,570 nm fall within the shaded range in the figure.

Then, an external resonator-type wavelength tunable laser device using a planar wavelength tunable mirror with $\Delta R=10$ dB was actually produced. The value of $\Gamma \cdot L$ of the semiconductor optical amplifier, serving as a semiconductor gain medium, was then varied within the range shown in FIG. 6. In FIG. 6, points at which the desired wavelength tunable range was successfully achieved are shown by circles. Points at which the desired wavelength tunable range failed to be achieved are shown by crosses. The desired wavelength tunable range was successfully achieved under the condition corresponding to the inside of the shaded region but this range could not be achieved outside the shaded region.

That is, the above-described verification indicates that $\Gamma \cdot L$ can be effectively used as an index.

In the semiconductor optical amplifier comprising eight layers of MQWs and having an element length of 1,000 μm, as described above by way of example, the optical confinement coefficient is about 0.066, and $\Gamma \cdot L$ is thus 66 μm. This value deviates significantly from the range shown in FIG. 6 and thus fails to allow the desired wavelength tunable range to be achieved.

Figure 7:
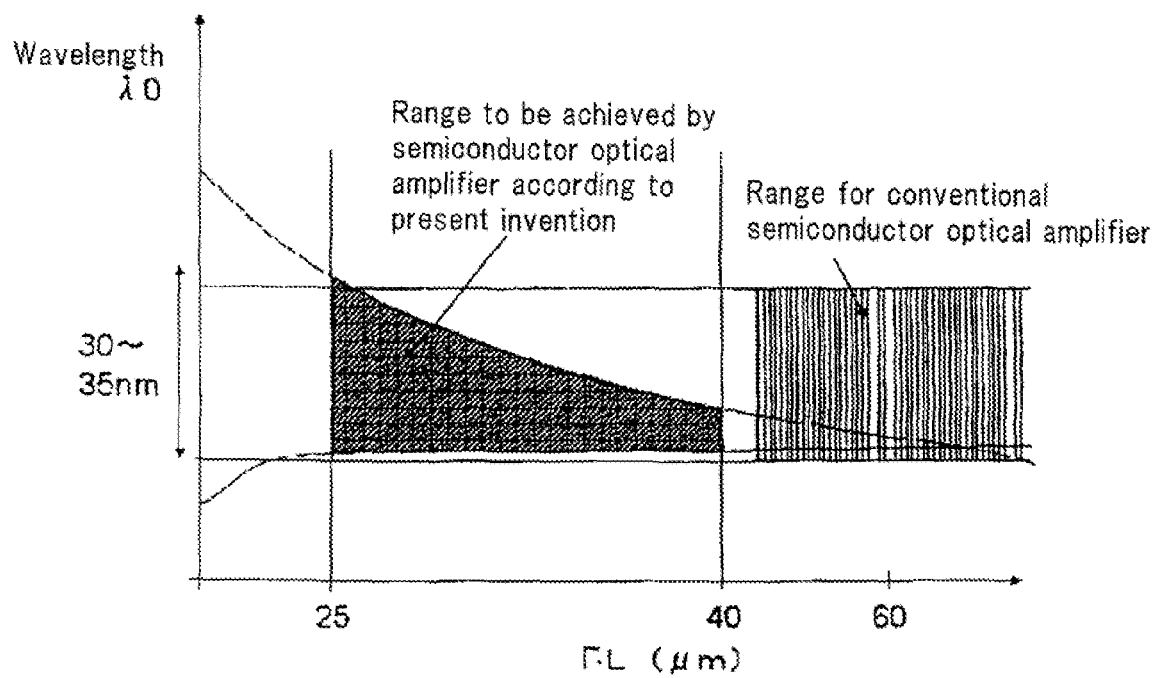
FIG. 7 is a diagram showing the range of a conventional laser oscillation condition for a semiconductor optical amplifier produced under this condition and the range of a laser oscillation condition for the semiconductor optical amplifier disclosed in the present invention and produced based on an index disclosed in the present invention.

FIG. 7 shows the ranges of $\Gamma \cdot L$ and $\lambda 0$ provided by a conventional semiconductor optical amplifier and the ranges of $\Gamma \cdot L$ and $\lambda 0$ provided by the configuration according to the present invention.

As shown in FIG. 7, the range disclosed in the present invention is different from the range defined based on the conventional concept of a combination with an external resonator-type laser such as a fiber Bragg grating, that is, the range defined by $\Gamma \cdot L$ achieved by a semiconductor optical amplifier with increased optical confinement coefficient $\Gamma$ and element length L.

As described above, based on the above discussions, the relationship between $\Gamma \cdot L$ and both $\Delta g$ and $\Delta Loss$ can be assumed as follows.

An active layer structure with a large $\Gamma \cdot L$ requires lower current density to offer the same gain. Thus, laser oscillation occurs at a lower current density. In this case, the gain curve is expected to depend more greatly on the wavelength. Furthermore, the mirror loss is expected to decrease. That is, the relationship between $\Delta g$ and $\Delta Loss$ is such that $\Delta g$ increases relatively and exceeds $\Delta Loss$, thus preventing the laser device from oscillating at the desired wavelength.

In contrast, in an active layer structure with small $\Gamma \cdot L$, the current density is increased in order to set the gain to be greater than the loss of the resonator in the external resonator-type wavelength tunable laser device. In this case, a phenomenon opposite to that described above occurs to make $\Delta g$ smaller than $\Delta Loss$. This is desirable for allowing the laser device to oscillate at desired wavelength $\lambda 1$.

However, if the threshold is reached at excessively high current density Jth, adverse effects such as heating of the elements and leakage current are more significantly exerted. Furthermore, an optical output is more quickly saturated in response to current injection, thus reducing the maximum optical output. Moreover, the lifetimes of the elements are disadvantageously reduced.

Thus, $\Gamma \cdot L$ has the optimum range. When the active layer used comprises quantum wells, the values of $\Gamma$ within the range can generally be varied depending on the number of well layers. Furthermore, L denotes the length of the gain region in the semiconductor optical amplifier. Thus, the value of L can be varied by adjusting the device size.

Figure 8:
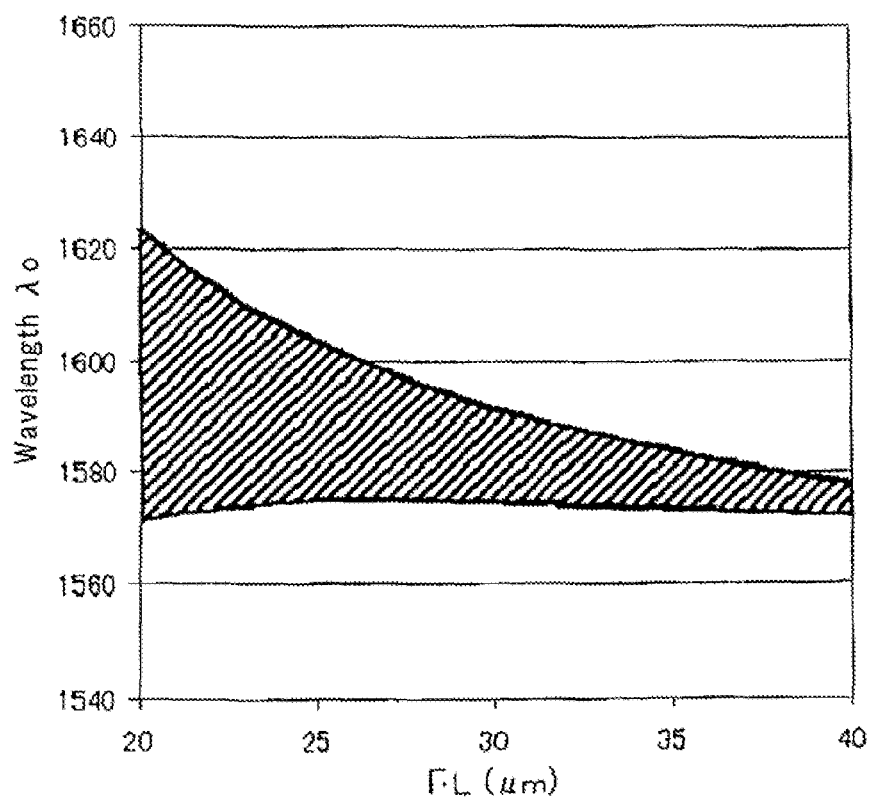
FIG. 8 is a diagram showing the range of a laser oscillation condition that the semiconductor optical amplifier must meet in order to obtain a wavelength tunable range of 1,530 nm to 1,570 nm if $\Delta R=8$ dB and the optical loss during one cycle of the external resonator-type wavelength tunable laser device is 20 dB to 25 dB.
Figure 9:
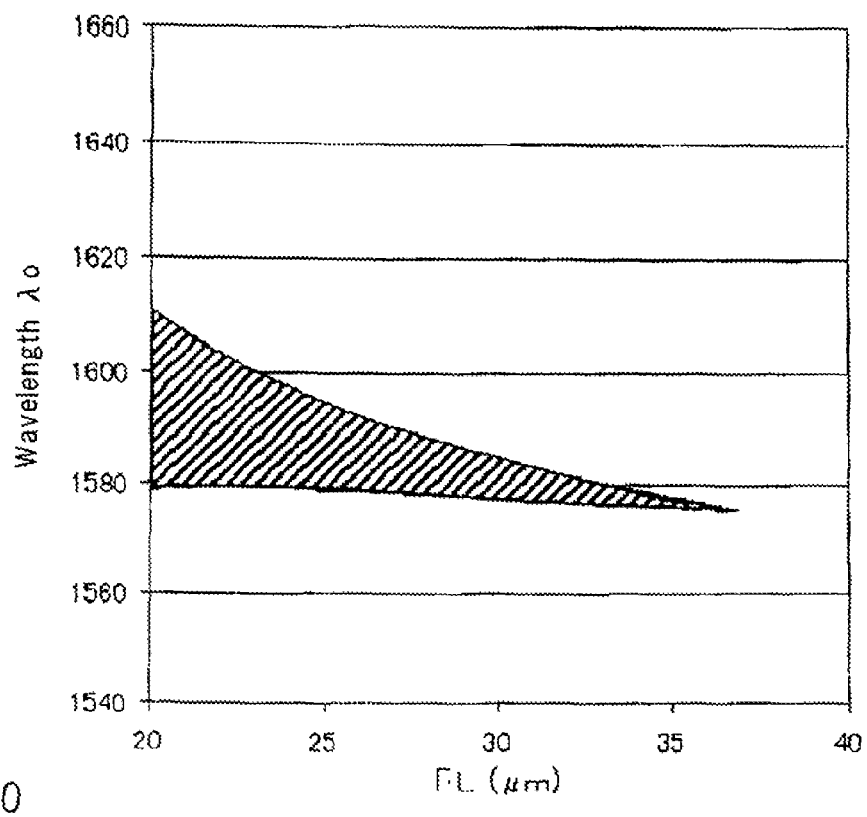
FIG. 9 is a diagram showing the range of a laser oscillation condition that the semiconductor optical amplifier must meet in order to obtain a wavelength tunable range of 1,530 nm to 1,570 nm if $\Delta R=6$ dB and the optical loss during one cycle of the external resonator-type wavelength tunable laser device is 20 dB to 25 dB.
Figure 10:
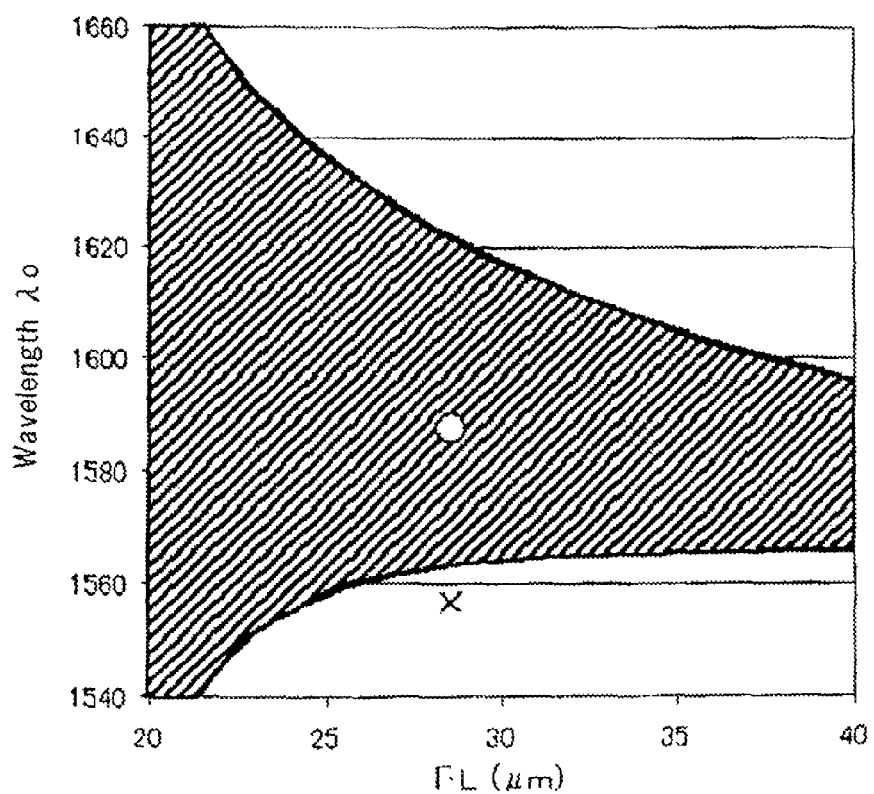
FIG. 10 is a diagram showing the range of a laser oscillation condition that the semiconductor optical amplifier must meet in order to obtain a wavelength tunable range of 1,530 nm to 1,570 nm if $\Delta R=16$ dB and an optical loss during one cycle of the external resonator-type wavelength tunable laser device is 20 dB to 25 dB.

Exactly the same examination was carried out for $\Delta R=8$ dB, $\Delta R=6$ dB, and $\Delta R=16$ dB. Since only $\Delta R$ is varied, the method carried out with $\Delta R=10$ dB needs to be varied only in the value of $\Delta R$. Thus, maximum value ($\lambda 0$, max) and minimum value ($\lambda 0$, min) of $\lambda 0$ can be determined for each $\Gamma \cdot L$ as accurately as in the case of $\Delta R=10$ dB. The results for $\Delta R=8$ dB, $\Delta R=6$ dB, and $\Delta R=16$ dB are shown in FIGS. 8, 9, and 10, respectively.

Figure 11:
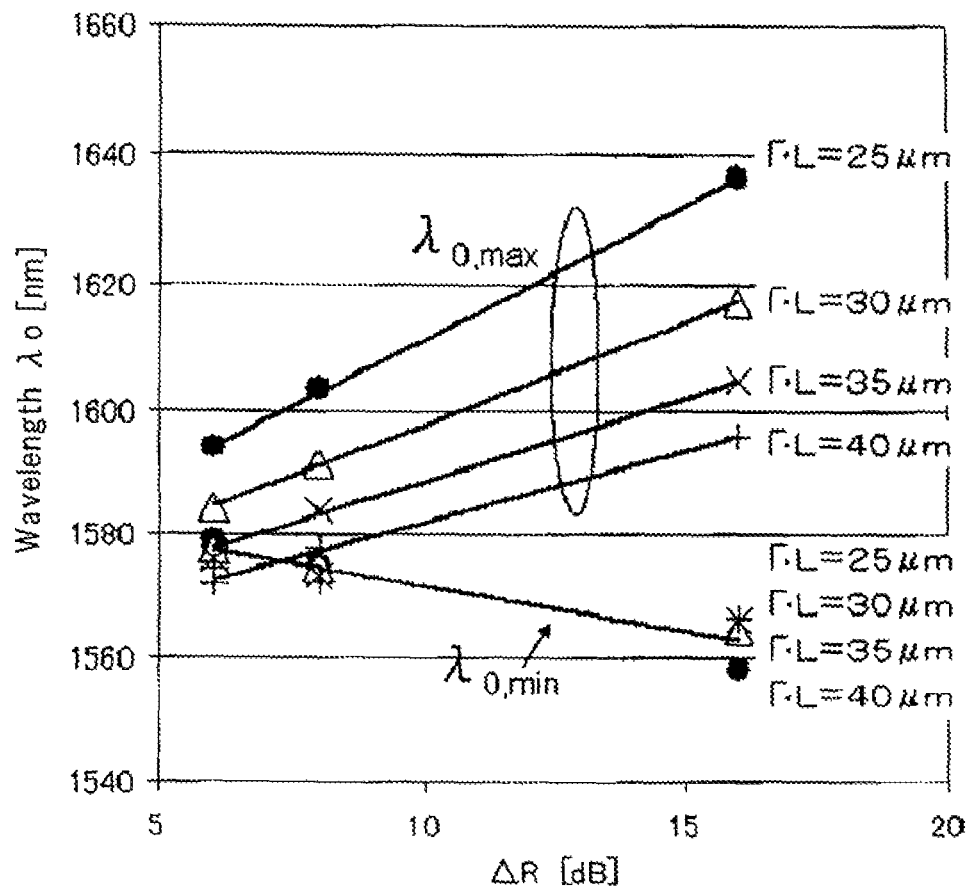
FIG. 11 is a diagram showing the dependence of the allowable maximum value $\lambda 0$, max and allowable minimum value $\lambda 0$, min of $\lambda 0$ on $\Delta R$, which is extracted using $\Gamma \cdot L$ as a parameter.

Based on the results shown in FIGS. 6 and 8 to 10, ($\lambda 0$, max) and ($\lambda 0$, min) can be determined for each $\Gamma \cdot L$. The present inventors have thus found that when $\Delta R$ is at least 6 dB and at most 16 dB, the dependence of $\lambda 0$ on $\Delta R$ can be almost expressed by a linear expression (straight line). The results are shown in FIG. 11.

Based on these results, in an external resonator-type wavelength tunable laser device in which the central wavelength of the desired variable range is $\lambda c$ (nm), the built-in planar wavelength tunable reflector has a reflectance difference $\Delta R$ (dB). Furthermore, the gain layer (active layer) in the built-in semiconductor gain medium comprises a multiple quantum well (MQW).

The present inventors also have found the following. When $\Gamma \cdot L$ is such that 25 μm<$\Gamma \cdot L$<40 μm and gain peak wavelength $\lambda 0$ (nm) observed during carrier injected with the maximum modal gain equal to the internal loss of the semiconductor gain medium is larger than $-3 \cdot \Delta R/2 + (\lambda c + 35)$ and smaller than $(-(\Gamma \cdot L)/7 + 8) \cdot \Delta R + (-(\Gamma \cdot L) + \lambda c + 45)$, an external resonator-type wavelength tunable laser device can be implemented even though the device includes a planar optical reflection structure involving residual reflection.

Here, it should be noted that the coefficients by which $\Gamma \cdot L$ and $\Delta R$ are multiplied include respective units and hold true when $\Gamma \cdot L$ and $\Delta R$ are described in these units. That is, the above-described expression holds true only when $\Gamma \cdot L$ and $\Delta R$ are described in the units (μm and dB).

The built-in planar wavelength tunable reflector is characterized in that the above-described effect becomes significant when 6 dB$\leq \Delta R \leq$16 dB. When $\Delta R$ is larger than the maximum value of this range, the range of applicable $\lambda 0$ exceeds the wavelength tunable range of one wavelength band (C or L band), that is, 40 nm. Thus, an increase in $\Delta R$ invalidates the object of the present invention described in the specification. Furthermore, when $\Delta R$ is smaller than the minimum value of the above-described range, the allowable values of $\Gamma \cdot L$ and $\lambda 0$ used to achieve the wavelength tunable range of 40 nm are very small. Thus, implementing an advantageous wavelength tunable laser device with high maximum optical output power becomes difficult.

Furthermore, a passive region enabling the phase of light in the resonator of the external resonator-type wavelength tunable laser device to be varied is preferably integrated into the semiconductor optical amplifier.

This structure enables the Fabry-Perot mode of the external resonator to be accurately set to the desired wavelength by injecting a current into or by applying a voltage to the passive region. Thus, the wavelength can be accurately set to a wavelength grid specified for the optical communication system. As a result, the performance of the external resonator-type wavelength tunable laser device can be improved.

Furthermore, the semiconductor optical amplifier may be such that a waveguide lying close to the external resonator-side facet thereof is located in a direction different from the one perpendicular to the facet.

The presence of a reflection point inside the external resonator-type laser device results in formation of a complex resonator. This makes control of the laser oscillation wavelength difficult. When a waveguide lying close to the external resonator-side facet of the semiconductor optical amplifier is not perpendicular to the facet, the reflectance of the facet can be reduced. As a result, the wavelength control can be facilitated, and the performance of the device can be improved.

Furthermore, when optical confinement constant Γ and semiconductor gain medium length L of the semiconductor gain region are such that oscillation threshold current density Jth is at most $30\ kA/cm^2$, the current density during operation can be set to at most $30\ kA/cm^2$. Thus, the element lifetime of the wavelength tunable light source can be effectively sufficiently increased.

Provided that the gain layer (active layer) in the semiconductor gain medium comprises quantum wells, the value of λ0 can be varied by the strain of the quantum wells, the thickness of the layers, and the semiconductor composition of a barrier layer (for InGaAsP, the ratio of In to Ga and the ratio of As to P).

Exemplary Embodiment

Now, an exemplary embodiment will be described in detail with reference to the drawings.

Figure 12:
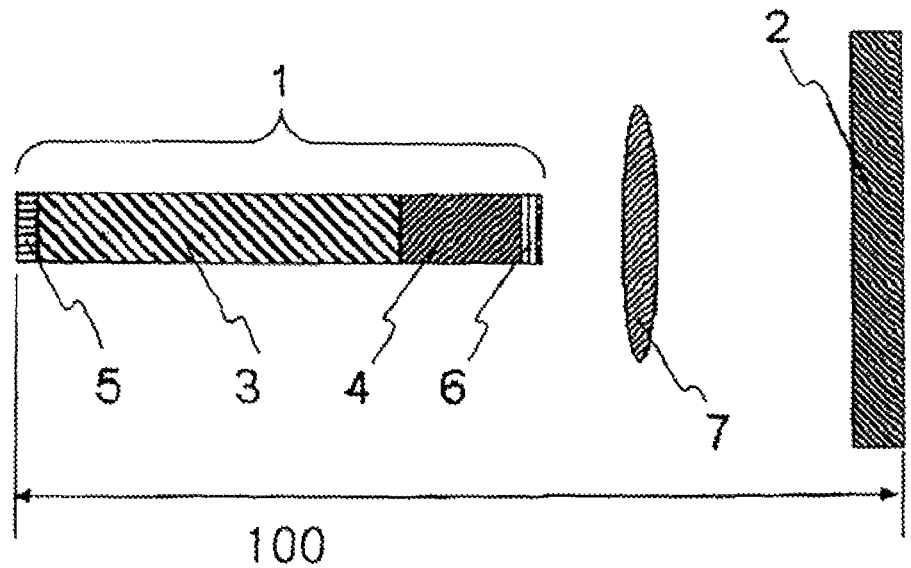
FIG. 12 is a diagram showing the configuration of an external resonator-type wavelength tunable laser device according to an exemplary mode for carrying out the present invention.

FIG. 12 is a diagram showing the configuration of an external resonator-type wavelength tunable laser device according to the exemplary embodiment.

The basic configuration of the external resonator-type wavelength tunable laser device includes semiconductor element 1 corresponding to a semiconductor gain medium and wavelength tunable reflector 2 that is a planar reflection structure allowing the reflection spectral peak wavelength to be varied. Semiconductor element 1 and wavelength tunable reflector 2 are combined to form external resonator 100.

Semiconductor element 1 includes the region of semiconductor optical amplifier 3 corresponding to an active element and phase adjustment region 4 in which a passive element configured to allow the phase of light in the resonator to be varied is formed.

A semiconductor optical amplifier 3 side of semiconductor element 1 corresponds to an optical output side. A low-reflection coating film 5 (reflectance: between 1% and 10%) is formed on the corresponding facet of semiconductor element 1. Furthermore, a phase adjustment region 4 side of semiconductor element 1 corresponds to an external resonator side. Anti-reflection coating film 6 (reflectance: at most 1%) is formed on the corresponding facet of semiconductor element 1. The phase adjustment region 4 side of semiconductor element 1 may correspond to the optical output side.

Semiconductor optical amplifier 3 comprises a multiple quantum well (MQW). When a current is injected into semiconductor optical amplifier 3, semiconductor optical amplifier 3 generates and amplifies light.

Phase adjustment region 4 comprises a bulk composition or a multiple quantum well and has a wide band gap set to a degree in which phase adjustment region 4 avoids absorbing laser oscillation light. Injecting a current into or applying a voltage to phase adjustment region 4 changes the refractive index of phase adjustment region 4 and thus the phase of the laser resonator.

Semiconductor optical amplifier 3 and phase adjustment region 4 are electrically sufficiently separated so as to avoid interfering with each other. Specifically, semiconductor optical amplifier 3 and phase adjustment region 4 are separated by separating resistance of at least 1 kiloohm.

Planar wavelength tunable reflector 2 is located opposite the optical output direction of semiconductor element 1. Collimating lens 7 is located between wavelength tunable reflector 2 and semiconductor element 1. Collimating lens 7 converts light beams from semiconductor element 1 into parallel light. The beams made parallel by collimating lens 7 then impinge on wavelength tunable reflector 2 and are reflected. The beams are then fed back to semiconductor element 1.

In the external resonator-type wavelength tunable laser device configured as described above, the technique according to the present invention is applied to semiconductor optical amplifier 3 included in semiconductor element 1. Then, even with the planar reflection structure allowing the reflection spectral peak wavelength to be varied, the device can offer a wavelength tunable range corresponding to one of the C and L bands in optical fiber communication.

The following is a condition to be met by the semiconductor optical amplifier in order to allow the external resonator-type wavelength tunable laser device configured using planar wavelength tunable reflector 2 to oscillate at wavelength λ1 near the reflection spectral peak of the wavelength tunable reflector: absolute value ΔLoss between the loss of wavelength tunable reflector at wavelength λ1 and the loss of wavelength tunable reflector at wavelength λ2 is larger than difference Δg between the gain of the semiconductor optical amplifier at wavelength λ1 and the gain of the semiconductor optical amplifier at wavelength λ2.

A semiconductor optical amplifier having Γ·L and λ0 as described in the specification may be produced to allow an external resonator-type wavelength tunable laser device to be implemented using a wavelength tunable reflector generally having a refection difference ΔR of 6 dBs≦ΔR≦16 dB.

Specifically, Γ·L is such that 25 μm<Γ·L<40 μm. Furthermore, gain peak wavelength λ0 (nm) observed during carrier injected with the maximum modal gain equal to the internal loss of the semiconductor gain medium is larger than −3·ΔR/2+(λc+35) and smaller than (−(Γ·L)/7+8)·ΔR+(−(Γ·L)+λc+45).

The more specific range of values of ΔR may be as shown in the figures in the application. FIG. 10 shows the ranges of Γ·L and λ0 that provide the wavelength tunable range of the C band (1,530 nm to 1,570 nm) when ΔR=16 dB.

FIG. 6 shows the ranges that are similarly obtained when ΔR=10 dB.

FIG. 8 shows the ranges that are similarly obtained when ΔR=8 dB.

FIG. 9 shows the ranges similarly obtained when ΔR=6 dB. Depending on the value of ΔR of the wavelength tunable reflector used, a semiconductor optical amplifier with Γ·L and λ0 included within the range may be used.

In the present exemplary embodiment, by completely matching the laser oscillation wavelength with the maximum reflection peak wavelength of wavelength tunable reflector 2, the wavelength can be accurately set to the wavelength grid specified for the optical communication system. Matching the laser oscillation wavelength can be achieved by passing a current through phase adjustment region 4 provided on semiconductor element 1 to change the refractive index.

Furthermore, in the present exemplary embodiment, low-reflection coating film 5 on the optical output side is set to have a reflectance of 1% to 10% because a reflectance of less than 1% increases a laser threshold to prevent a high optical output from being obtained. Moreover, a reflectance of more than 10% sets the transmittance of low-reflection coating film 4 to less than 90%. This also prevents a high optical output from being obtained.

[Description of a Manufacturing Method]

Now, a method for manufacturing an external resonator-type wavelength tunable laser device according to an exemplary embodiment will be described.

First, a method for manufacturing semiconductor element 1 will be described. Semiconductor element 1 comprises a semiconductor substrate, a circuit forming semiconductor optical amplifier 3, and a circuit used as phase adjustment region 4; the circuits are integrated on the semiconductor substrate. The integration may be carried out using a well-known butt joint technique or a well-known selective growth technique. If the butt joint technique is used, for example, the following production method is carried out.

First, an MQW structure used as semiconductor optical amplifier 3 is grown. In this case, the MQW structure is grown so as to meet the above-described ranges of L and $\lambda 0$ based on the residual reflectance $\Delta R$ of wavelength tunable reflector 2 that is used.

The value of $\Gamma$ is determined by calculating a waveguide mode based on the optical confinement structure. Thus, the value of $\Gamma$ allows the required width of a quantum well and the required number of well layers to be determined. The number of well layers is normally about 3 to 10. The value of L may be set depending on the value of $\Gamma$. However, an excessively small value of L disadvantageously reduces a saturated optical output or increases the current density during operation. Thus, the value of L is often set to between about 300 µm and 1,500 µm.

Furthermore, when the MQW structure is grown, a gain of absolute wavelength $\lambda 0$ of an active layer in the MQW structure is usually estimated based on a PL (Photo Luminescence) peak value. The PL wavelength varies depending on the intensity of an excitation light source for a measuring system for the PL wavelength and the light emission efficiency of the MQW. Thus, the correlation between the PL wavelength and $\lambda 0$ needs to be pre-examined. Normally, the PL wavelength is often shorter than $\lambda 0$ by about 20 to 30 nm.

A part of the thus produced MQW structure is removed by wet etching or dry etching. An optical waveguide structure corresponding to a phase adjustment region is then grown. This structure needs to sufficiently reduce the wavelength of light emitted by the semiconductor optical amplifier, thus lessening the absorption in the phase adjustment region. The structure may be a bulk or MQW.

First, the phase adjustment region may be grown and undesired portions may be removed before the MQW structure of the semiconductor optical amplifier is grown.

Then, undesired regions are removed by dry or wet etching through a dielectric such as $SiO_2$ as a mask, with a region corresponding to an optical waveguide left. The width of the optical waveguide is desirably between about 0.5 µm and 2 µm. In this case, a region may be left in which electrons and holes that leak to a block structure are re-coupled together.

Then, a pup block structure of InP is grown and a p-type InP clad is grown as required.

After the growth, a layer having a small electric resistance is removed by etching or the like to electrically separate the semiconductor optical amplifier from the phase adjustment region.

Then, a dielectric such as $SiO_2$ is deposited. A current injection region (striped portion) is produced by etching or the like.

Thereafter, a (p) electrode is deposited. The deposited electrode is removed from regions where the electrode is unnecessary. The substrate is then thinned by polishing. An (n) electrode is deposited on the back surface of the substrate.

As above, the substrate with large number of semiconductor elements 1 produced thereon is cut into bars by cleavage, so that a large number of semiconductor elements 1 are connected together in the lateral direction.

In this case, the cutting is carried out so as to obtain a resonator length (semiconductor gain medium length) L at which above-described $\Gamma \cdot L$ has the desired value. Coating is applied to the cleaved facet.

To allow the semiconductor optical amplifier 3 side to be set to be the optical output side, low-reflection coating film 5 is applied to the corresponding facet of the semiconductor element by depositing a multilayer film of a dielectric. To allow the opposite, phase adjustment region 4 side to be set to be the external resonator side, anti-reflection coating film 6 is applied to the corresponding facet of the semiconductor element by depositing a multilayer film of another dielectric.

Thereafter, the semiconductor elements are separated from one another. Each of the semiconductor elements is mounted on a subcarrier together with wavelength tunable reflector 2 and collimating lens 7. At this time, a current is passed through semiconductor element 1 to allow semiconductor element 1 to emit light. The components are accurately arranged such that light beams travel linearly.

The above-described steps allow an external resonator-type wavelength tunable laser device to be produced.

(Other Aspects of the Invention)

If the external resonator-type wavelength tunable laser device according to the present invention is implemented using a component group other than the one described above, the effects of the present invention are expected to be exerted as described above when a planar reflection structure enabling the reflection spectral peak wavelength to be varied is used.

Furthermore, in the above description, the C band (between 1,530 nm and 1,570 nm) is taken as an example of the wavelength tunable range. However, the present invention is applicable to any other wavelength bands, for example, the S or L bands for optical communication.

The circuit of phase adjustment region 4 integrated in semiconductor element 1 need not be monolithically integrated with semiconductor optical amplifier 3 but may be present in the external resonator as an independent component. Alternatively, the phase adjustment function can be implemented by allowing a well-known piezo device or the like to slightly move the semiconductor optical amplifier or the wavelength tunable reflector.

Furthermore, semiconductor optical amplifier 3 may be such that a waveguide lying close to the external resonator-side facet thereof is located in a direction not perpendicular to the facet.

The presence of a reflection point inside the external resonator-type laser results in formation of a complex resonator. This makes controlling the laser oscillation wavelength difficult. Thus, when the waveguide lying close to the external resonator-side facet of semiconductor optical amplifier 3 is not perpendicular to the facet, the reflectance of the facet can be reduced. As a result, performance of the device can be improved.

First Example

A first example will be described below with reference to the drawings.

Figure 13:
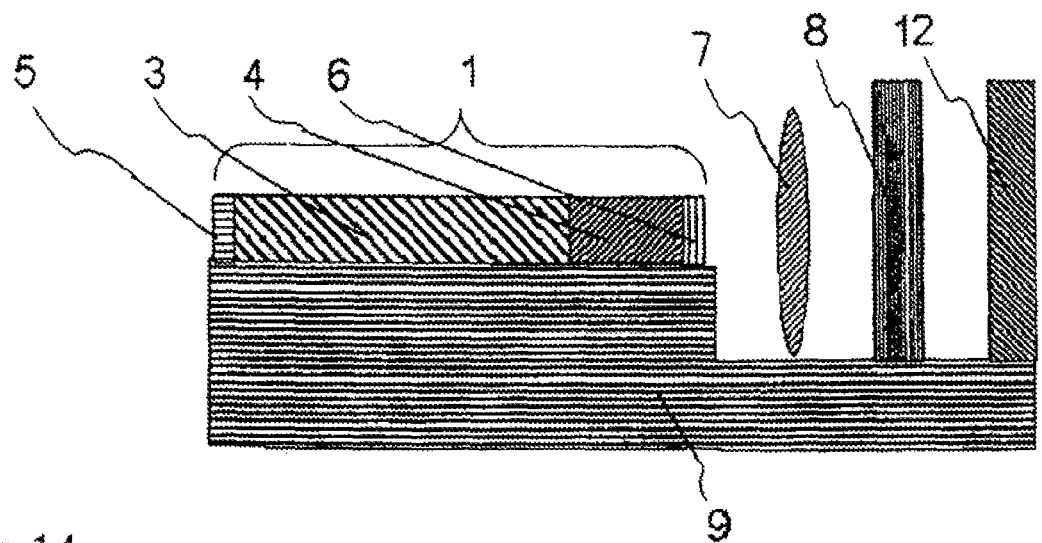
FIG. 13 is a diagram showing the configuration of an external resonator-type wavelength tunable laser device according to a first example, a second example, and a third example.

FIG. 13 is a diagram showing the configuration of an external resonator-type wavelength tunable laser device corresponding to the first example. In FIG. 13, the same components as those described above are denoted by the same reference numerals.

The external resonator-type wavelength tunable laser device according to the first example comprises semiconductor element 1 including semiconductor optical amplifier 3, collimating lens 7, planar wavelength tunable filter 8, and wavelength tunable reflection mirror 12 with an operation range corresponding to the vicinity of the C band (between 1,530 nm and 1,570 nm). The reflectance difference ΔR of wavelength tunable reflection mirror 12 is 8 dB.

Semiconductor element 1 includes circuit forming semiconductor optical amplifier 3 and a circuit used as phase adjustment region 4; the circuits are monolithically integrated. This integration was carried out using the butt joint technique.

First, an MQW structure used as semiconductor optical amplifier 3 is grown. Six MQW layers (each well was 1.58 μm in thickness and was composed of compressively strained InGaAsP, and each barrier was 1.2 μm in thickness and was composed of InGaAsP) were grown at a growth pressure of 98.6 kPa and a growth temperature of 625° C. SCH (Separate Confinement Heterostructure) was placed before and after the layers. Γ of the well region was set to 0.05. Setting resonator length L to 600 μm allows Γ·L to be set to 30 μm.

Through pre-examinations, the difference between PL wavelength λPL provided by the MQW structure and λ0 had been found to be λ0−λPL=26 nm. Thus, the MQW layer was grown so as to provide a PL wavelength of 1,560 nm.

Thus, a semiconductor optical amplifier corresponding to a shaded portion shown in FIG. 8 can be obtained.

Then, a part of the produced MQW structure was removed by dry etching. An optical waveguide structure corresponding to phase adjustment region 4 was grown at a growth pressure of 98.6 kPa and a growth temperature of 625° C. The optical waveguide structure had a bulk structure as a core and was 170 nm in thickness. The optical waveguide structure had such a composition as offered a PL wavelength of 1.3 μm.

Thereafter, a dielectric such as $SiO_2$ was deposited. A trench of depth 2 μm was formed by dry etching to remove undesired regions, using, as a mask, a striped portion (current injection region) serving as an optical waveguide and a portion configured to re-couple electrons and holes leaking to the block structure. The width of the optical waveguide was set to 1.5 μm Then, a pnp block structure with a layer thickness of 2 μm was grown using InP. The $SiO_2$ mask was removed. Then, by means of overall growth, a p-type InP clad layer with a layer thickness of 2 μm and a p$^+$-type InGaAs contact layer with a layer thickness of 0.3 μm were grown at a growth pressure of 13.3 kPa.

Thereafter, the contact layer was removed to electrically separate semiconductor optical amplifier 3 from phase adjustment region 4. An $SiO_2$ film was deposited all over the surface of the resulting structure. A current injection window was formed in the $SiO_2$ film. A Cr/Au upper (p) electrode was deposited by a sputtering method. The electrode was patterned so as to be separated into pieces corresponding to the respective regions. The substrate was polished, and an AuGeNi lower electrode was then deposited by the sputtering method.

Thereafter, semiconductor element 1 was formed by the cleaving method so that the semiconductor optical amplifier region was 600 μm in length, whereas the phase adjustment region was 200 μm in length.

Thereafter, to allow the semiconductor optical amplifier 3 side to be set to be the optical output side, low-reflection coating film 5 was applied to the corresponding facet of the semiconductor element by depositing a multilayer film of a dielectric. To set the opposite phase adjustment region 4 side to the external resonator side, anti-reflection coating film 6 was applied to the corresponding facet of the semiconductor element by depositing a multilayer film of another dielectric.

Finally, semiconductor element 1 was divided into pieces. Each of resulting semiconductor elements 1 was mounted on subcarrier 9 together with wavelength tunable reflection mirror 12, collimating lens 7, and wavelength tunable filter 8. At this time, a current was passed through semiconductor element 1 to allow semiconductor element 1 to emit light. The components were accurately arranged such that light beams could travel linearly. As a result, an external resonator-type wavelength tunable laser device was produced.

The external resonator-type wavelength tunable laser device can vary the wavelength between 1,525 nm and 1,568 nm. The external resonator-type wavelength tunable laser device oscillated with a current of at most 20 mA, corresponding to a threshold, in all the wavelength bands.

When a current of about 8 mA was injected into phase adjustment region 4, the light intensity was successfully adjustably maximized at a wavelength specified for the optical communication system. Furthermore, the device exhibited proper characteristics, for example, the maximum optical output was 32 mW in terms of fiber coupling optical output. Thus, the method according to the present invention successfully provided a sufficient wavelength tuning function.

Second Example

A second example will be described below with reference to the drawings.

The configuration of an external resonator-type wavelength tunable laser device according to the second example is the same as that according to the first example (FIG. 13).

The external resonator-type wavelength tunable laser device according to the present example comprises semiconductor element 1 including semiconductor optical amplifier 3, collimating lens 7, planar wavelength tunable filter 8, and wavelength tunable reflection mirror 12 with an operation range that corresponds to the vicinity of the C band (between 1,530 nm and 1,570 nm). The reflectance difference ΔR of wavelength tunable reflection mirror 12 is 8 dB.

Semiconductor element 1 includes circuit forming semiconductor optical amplifier 3 and a circuit used as phase adjustment region 4; the circuits are monolithically integrated. This integration was carried out using the butt joint technique.

First, an MQW structure used as semiconductor optical amplifier 3 is grown. Eight MQW layers (each well was 1.58 μm in thickness and was composed of compressively strained InGaAsP, and each barrier was 1.2 μm in thickness and was composed of InGaAsP) were grown at a growth pressure of 98.6 kPa and a growth temperature of 625° C. SCH was placed before and after the layers. Γ of the well region was set to 0.066. Setting resonator length L to 450 μm allows Γ·L to be set to 29.7 μm.

Through pre-examinations, the difference between PL wavelength λPL provided by the MQW structure and λ0 had been found to be λ0−λPL=26 nm. Thus, the MQW layer was grown so as to offer a PL wavelength of 1,560 nm.

Thus, a semiconductor optical amplifier corresponding to a shaded portion shown in FIG. 8 can be obtained.

Then, a part of the produced MQW structure was removed by dry etching. An optical waveguide structure corresponding to phase adjustment region 4 was grown at a growth pressure of 98.6 kPa and a growth temperature of 625° C. The optical waveguide structure had a bulk structure as a core and was 170 nm in thickness. The optical waveguide structure had such a composition that provided a PL wavelength of 1.3 μm.

Thereafter, a dielectric such as $SiO_2$ was deposited. A trench of depth 2 μm was formed by dry etching to remove undesired regions, using, as a mask, a striped portion (current injection region) serving as an optical waveguide and a portion configured to re-couple electrons and holes leaking to the block structure. The width of the optical waveguide was set to 1.5 μm. The optical waveguide was smoothly bent so as to have a 1 mm radius of curvature and to incline, at the cleaved position, at seven degrees with the resonator facet (cleaved facet).

Then, a pup block structure with a layer thickness of 2 μm was grown using InP. The $SiO_2$ mask was removed. Then, by means of overall growth, a p-type InP clad layer with a layer thickness of 2 μm and a $p^+$-type InGaAs contact layer with a layer thickness of 0.3 μm were grown at a growth pressure of 13.3 kPa.

Thereafter, the contact layer was removed to electrically separate semiconductor optical amplifier 3 from phase adjustment region 4. An $SiO_2$ film was deposited all over the surface of the resulting structure. A current injection window was formed in the $SiO_2$ film. A Cr/Au upper (p) electrode was deposited by the sputtering method. The electrode was patterned so as to be separated into pieces corresponding to the respective regions. The substrate was polished, and an AuGeNi lower electrode was then deposited by the sputtering method.

Thereafter, semiconductor element 1 was formed by the cleaving method so that the semiconductor optical amplifier region was 450 μm in length, whereas the phase adjustment region was 200 μm in length.

Thereafter, to allow the semiconductor optical amplifier 3 side to be set to be the optical output side, low-reflection coating film 5 was applied to the corresponding facet of the semiconductor element by depositing a multilayer film of a dielectric. To set the opposite phase adjustment region 4 side to the external resonator side, anti-reflection coating film 6 was applied to the corresponding facet of the semiconductor element by depositing a multilayer film of another dielectric.

Finally, semiconductor element 1 was divided into pieces. Each of resulting semiconductor elements 1 was mounted on subcarrier 9 together with wavelength tunable reflection mirror 12, collimating lens 7, and wavelength tunable filter 8. At this time, a current was passed through semiconductor element 1 to allow semiconductor element 1 to emit light. The components were accurately arranged so as to minimize the loss of light. As a result, an external resonator-type wavelength tunable laser device was produced.

The external resonator-type wavelength tunable laser device can vary the wavelength between 1,527 nm and 1,570 nm. The external resonator-type wavelength tunable laser device oscillated with a current of at most 20 mA, corresponding to a threshold, in all the wavelength bands.

When a current of about 8 mA was injected into phase adjustment region 4, the light intensity was successfully adjustably maximized at a wavelength specified for the optical communication system. Furthermore, the device exhibited proper characteristics, for example, the maximum optical output was 30 mW in terms of fiber coupling optical output. Thus, the method according to the present invention successfully provided a sufficient wavelength tuning function.

Third Example

A third example will be described below with reference to the drawings.

The configuration of an external resonator-type wavelength tunable laser device according to the third example is the same as that according to the first example (FIG. 13).

The external resonator-type wavelength tunable laser device according to the present example comprises semiconductor element 1 including semiconductor optical amplifier 3, collimating lens 7, wavelength tunable filter 8, and wavelength tunable reflection mirror 12 with an operation range of about 1,565 nm and 1,615 nm. ΔR of wavelength tunable reflection mirror 12 is 16 dB.

Semiconductor element 1 includes a circuit forming semiconductor optical amplifier 3 and a circuit used as phase adjustment region 4; the circuits are monolithically integrated. This integration was carried out using the butt joint technique.

First, an MQW structure used as semiconductor optical amplifier 3 is grown. Six MQW layers (each well was 1.62 μm in thickness and was composed of compressively strained InGaAsP, and each barrier was 1.24 μm in thickness and was composed of InGaAsP) were grown at a growth pressure of 98.6 kPa and a growth temperature of 625° C. SCH was placed before and after the layers. Γ of the well region was set to 0.051. Setting resonator length L to 600 μm allows Γ·L to be set to 30.6 μm. The MQW layer was grown so as to offer a PL wavelength of 1,600 nm.

Through pre-examinations, the difference between PL wavelength λPL provided by the MQW structure and λ0 had been found to be λ0−λPL=26 nm. Accordingly, λ0=1,626 nm.

Thus, when the MQW structure is produced such that λ0=1,626 nm and Γ·L=30.6 μm, λz=1,590 nm and ΔR=16 dB. Consequently, Γ·L is such that 25 μm<Γ·<40 μm, and λ0 (mu) is larger than −3·ΔR/2+(λc+35)=1,601 (nm) and smaller than (−(Γ·L)/7+8)·ΔR+(−(Γ·L)+λc+45)=1,662 (nm). Therefore, the values fall within the ranges disclosed in the patent, allowing the effects disclosed in the patent to be exerted.

Then, a part of the produced MQW structure was removed by dry etching. An optical waveguide structure corresponding to phase adjustment region 4 was grown at a growth pressure of 98.6 kPa and a growth temperature of 625° C. The optical waveguide structure had a bulk structure as a core and was 170 nm in thickness. The optical waveguide structure had such a composition as that provided a PL wavelength of 1.4 μm.

Thereafter, a dielectric such as $SiO_2$ was deposited. A trench of depth 2 μm was formed by dry etching to remove undesired regions, using, as a mask, a striped portion (current injection region) serving as an optical waveguide and a portion configured to re-couple electrons and holes leaking to the block structure. The width of the optical waveguide was set to 1.5 μm.

Then, a pnp block structure with a layer thickness of 2 μm was grown using InP. The SiO₂ mask was removed. Then, by means of overall growth, a p-type InP clad layer with a layer thickness of 2 μm and a p⁺-type InGaAs contact layer with a layer thickness of 0.3 μm were grown at a growth pressure of 13.3 kPa.

Thereafter, the contact layer was removed to electrically separate semiconductor optical amplifier 3 from phase adjustment region 4. An SiO₂ film was deposited all over the surface of the resulting structure. A current injection window was formed in the SiO₂ film. A Cr/Au upper (p) electrode was deposited by the sputtering method. The electrode was patterned so as to be separated into pieces corresponding to the respective regions. The substrate was polished, and an AuGeNi lower electrode was then deposited by the sputtering method.

Thereafter, semiconductor element 1 was formed by the cleaving method so that the semiconductor optical amplifier region was 600 μm in length, whereas the phase adjustment region was 200 μm in length.

Thereafter, to allow the semiconductor optical amplifier 3 side to be set to be the optical output side, low-reflection coating film 5 was applied to the corresponding facet of the semiconductor element by depositing a multilayer film of a dielectric. To set the opposite phase adjustment region 4 side to the external resonator side, anti-reflection coating film 6 was applied to the corresponding facet of the semiconductor element by depositing a multilayer film of another dielectric.

Finally, semiconductor element 1 was divided into pieces. Each of resulting semiconductor elements 1 was mounted on subcarrier 9 together with wavelength tunable reflection mirror 12, collimating lens 7, and wavelength tunable filter 8. At this time, a current was passed through semiconductor element 1 to allow semiconductor element 1 to emit light. The components were accurately arranged so that light beams traveled linearly. As a result, an external resonator-type wavelength tunable laser device was produced.

The external resonator-type wavelength tunable laser device can vary the wavelength between 1,571 nm and 1,611 nm. The external resonator-type wavelength tunable laser device oscillated with a current of at most 25 mA, corresponding to a threshold, in all the wavelength bands.

When a current of about 10 mA was injected into phase adjustment region 4, the light intensity was successfully adjustably maximized at a wavelength specified for the optical communication system. Furthermore, the device exhibited proper characteristics, for example, the maximum optical output was 20 mW in terms of fiber coupling optical output. Thus, the method according to the present invention successfully provided a sufficient wavelength tuning function.

Fourth Example

A fourth example will be described below with reference to the drawings.

Figure 14:
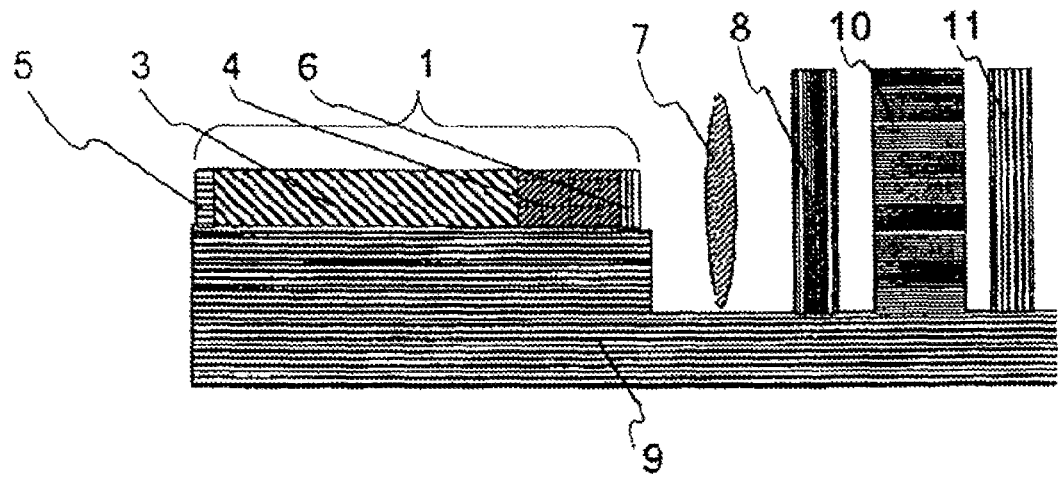
FIG. 14 is a diagram showing the configuration of an external resonator-type wavelength tunable laser device according to a fourth example.

FIG. 14 is a diagram showing the configuration of an external resonator-type wavelength tunable laser device corresponding to a fourth example. In FIG. 14, the same components as described above are denoted by the same reference numerals.

The external resonator-type wavelength tunable laser device according to the present example comprises semiconductor element 1 including semiconductor optical amplifier 3, collimating lens 7, wavelength tunable filter 8, and wavelength tunable filter 10 and total reflection mirror 11 which have an operation range corresponding to the vicinity of the L band (between 1,570 nm and 1,610 nm). Wavelength tunable reflector 2 formed by wavelength tunable filter 10 and total reflection mirror 11 has a reflectance difference ΔR of 6 dB.

Semiconductor element 1 includes a circuit forming semiconductor optical amplifier 3 and a circuit used as phase adjustment region 4; the circuits are monolithically integrated. This integration was carried out using the butt joint technique.

First, an MQW structure used as semiconductor optical amplifier 3 is grown. Six MQW layers (each well was 1.62 μm in thickness and was composed of compressively strained InGaAsP, and each barrier was 1.24 μm in thickness and was composed of InGaAsP) were grown at a growth pressure of 98.6 kPa and a growth temperature of 625° C. SCH was placed before and after the layers. Γ of the well region was set to 0.051. Setting resonator length L to 500 μm allows Γ·L to be set to 25.5 μm.

Through pre-examinations, the difference between PL wavelength λPL provided by the MQW structure and λ0 was found to be λ0−λPL=26 nm. Accordingly, the MQW layer was grown so as to provide a PL wavelength of 1,600 nm.

Thus, when the MQW structure is produced such that Γ·L=25.5 μm and λ0=1,626 nm, a λc=1,590 nm and ΔR=6 dB. Consequently, Γ·L is such that 25 μm<Γ·L<40 μm, and λ0 (nm) is larger than −3·ΔR/2+(λc+35)=1,616 (nm) and smaller than (−(Γ·L)/7+8)·ΔR+(−(Γ·L)+λc+45)=1,635 (nm). Therefore, the values fall within the ranges disclosed in the patent, allowing the effects disclosed in the patent to be exerted.

Then, a part of the produced MQW structure was removed by dry etching. An optical waveguide structure corresponding to phase adjustment region 4 was grown at a growth pressure of 98.6 kPa and a growth temperature of 625° C. The optical waveguide structure had a bulk structure as a core and was 170 nm in thickness. The optical waveguide structure had such a composition as offered a PL wavelength of 1.4 μm.

Thereafter, a dielectric such as SiO₂ was deposited. A trench of depth 2 μm was formed by dry etching to remove undesired regions, using, as a mask, a striped portion (current injection region) serving as an optical waveguide and a portion configured to re-couple electrons and holes leaking to the block structure. The width of the optical waveguide was set to 1.5 μm.

Then, a pnp block structure with a layer thickness of 2 μm was grown using InP. The SiO₂ mask was removed. Then, by means of overall growth, a p-type InP clad layer with a layer thickness of 2 μm and a p⁺-type InGaAs contact layer with a layer thickness of 0.3 μm were grown at a growth pressure of 13.3 kPa.

Thereafter, the contact layer was removed to electrically separate semiconductor optical amplifier 3 from phase adjustment region 4. An SiO₂ film was deposited all over the surface of the resulting structure. A current injection window was formed in the SiO₂ film. A Cr/Au upper (p) electrode was deposited by the sputtering method. The electrode was patterned so as to be separated into pieces corresponding to the respective regions. The substrate was polished, and an AuGeNi lower electrode was then deposited by the sputtering method.

Thereafter, semiconductor element 1 was formed by the cleaving method so that the semiconductor optical amplifier region was 500 μm in length, whereas the phase adjustment region was 200 μm in length.

Thereafter, to allow the semiconductor optical amplifier 3 side to be set to be the optical output side, low-reflection coating film 5 was applied to the corresponding facet of the semiconductor element by depositing a multilayer film of a dielectric. To set the opposite phase adjustment region 4 side to the external resonator side, anti-reflection coating film 6 was applied to the corresponding facet of the semiconductor element by depositing a multilayer film of another dielectric.

Finally, semiconductor element 1 was divided into pieces. Each of resulting semiconductor elements 1 was mounted on subcarrier 9 together with wavelength tunable filter 10, total reflection mirror 11, collimating lens 7, and wavelength tunable filter 8. At this time, a current was passed through semiconductor element 1 to allow semiconductor element 1 to emit light. The components were accurately arranged so that light beams traveled linearly. As a result, an external resonator-type wavelength tunable laser device was produced.

The external resonator-type wavelength tunable laser device can vary the wavelength between 1,575 nm and 1,615 nm. The external resonator-type wavelength tunable laser device oscillated with a current of at most 25 mA, corresponding to a threshold, in all the wavelength bands.

When a current of about 10 mA was injected into phase adjustment region 4, the light intensity was successfully adjustably maximized at a wavelength specified for the optical communication system. Furthermore, the device exhibited proper characteristics, for example, the maximum optical output was 20 mW in terms of fiber coupling optical output. Thus, the method according to the present invention successfully provided a sufficient wavelength tuning function.

Several examples and exemplary embodiments have been described above. However, the present invention is not limited to these examples and exemplary embodiments. Of course, various changes may be made to the examples and exemplary embodiments without departing from the technical concept of the present invention.

Examples of applications of the present invention include medium- and long-distance light sources for wavelength multiplexing communication used for trunk systems and access systems.

The invention claimed is:

1. An external resonator-type wavelength tunable laser device including at least a planar reflection structure enabling a reflection spectral peak wavelength to be varied, and a semiconductor gain medium, wherein the external resonator-type wavelength tunable laser device contains the semiconductor gain medium comprising a multiple quantum well in which, when reflectance difference $\Delta R$ (dB) of the planar reflection structure is defined by $\Delta R = 10 \cdot \log(R1/R2)$, in which R1 denotes reflectance R1(%) of the planar reflection structure at reflection spectral peak wavelength $\lambda 1$ (nm) thereof and R2 denotes reflectance R2(%) of the reflection structure at a wavelength $\lambda 2$ (nm) at which a gain of the semiconductor gain medium is maximized during laser oscillation, and a wavelength at a center of an operating wavelength range of the wavelength tunable laser device is defined as $\lambda c$ (nm), product $\Gamma \cdot L$ of optical confinement constant $\Gamma$ and semiconductor gain medium region length L ($\mu$m) of a gain layer in the semiconductor gain medium is at least 25 $\mu$m and at most 40 $\mu$m, and gain peak wavelength $\lambda 0$ (nm) observed during a time when a carrier is injected with a maximum modal gain equal to an internal loss of the semiconductor gain medium is larger than $-3 \cdot \Delta R/2 + (\lambda c + 35)$ and smaller than $(-(\Gamma \cdot L)/7 + 8) \cdot \Delta R + (-(\Gamma \cdot L) + \lambda c + 45)$, wherein the internal loss of the semiconductor gain medium is a loss of optical power absorbed at an inside of an active layer of the semiconductor gain medium, the gain peak wavelength $\lambda 0$ (nm) is a gain peak wavelength upon a carrier being injected into the active layer such that a net gain, equal to a peak gain minus the internal loss, is zero within the semiconductor gain medium.

2. The external resonator-type wavelength tunable laser device according to claim 1, wherein reflectance difference $\Delta R$ of the planar reflection structure is at least 6 dB and at most 16 dB.

3. The external resonator-type wavelength tunable laser device according to claim 1, wherein the semiconductor gain medium is formed of a semiconductor optical amplifier in which a passive region configured to enable a variation in a phase of light in a resonator of the external resonator-type wavelength tunable laser device is integrated.

4. The external resonator-type wavelength tunable laser device according to claim 1, wherein the semiconductor gain medium is formed of a semiconductor optical amplifier in which a waveguide lying close to a reflection structure-side facet of the semiconductor optical amplifier is located in a direction different from a direction that is perpendicular to the facet.

5. The external resonator-type wavelength tunable laser device according to claim 1, wherein the semiconductor gain medium has optical confinement constant $\Gamma$ and region length L such that oscillation threshold current density Jth is, at most, 30 kA/cm2.

* * * * *